United States Patent [19]

Abe et al.

[11] 4,152,618

[45] May 1, 1979

[54] LIGHT-EMITTING DISPLAY DEVICE INCLUDING LIGHT DIFFUSING FILM

[75] Inventors: Osamu Abe, Yokohama; Hiroshi Fujita, Kawasaki, both of Japan

[73] Assignee: Tokyo Shibaura Electric Co., Ltd., Tokyo, Japan

[21] Appl. No.: 891,405

[22] Filed: Mar. 29, 1978

[30] Foreign Application Priority Data

Apr. 5, 1977 [JP] Japan .................................. 52-38046

[51] Int. Cl.² ............................................. H01L 33/00
[52] U.S. Cl. ..................................... 313/116; 313/113; 313/499; 313/512; 350/188; 362/355; 362/800
[58] Field of Search ............... 313/113, 116, 501, 510, 313/512, 498, 499; 357/17; 307/311; 250/211 J; 350/188; 362/343, 355, 800

[56] References Cited

U.S. PATENT DOCUMENTS

| 3,821,590 | 6/1974 | Kosman et al. ........................ 313/499 |
| 3,875,456 | 4/1975 | Kano et al. ............................ 313/501 |
| 4,013,916 | 3/1977 | Brown ................................... 313/510 |

FOREIGN PATENT DOCUMENTS 2633191  1/1978  Fed. Rep. of Germany ............. 357/17

*Primary Examiner*—Siegfried H. Grimm
*Attorney, Agent, or Firm*—Oblon, Fisher, Spivak, McClelland & Maier

[57] ABSTRACT

A light-emitting display device comprising a light-emitting element, a substrate on which the light-emitting element is disposed, a reflector for reflecting the light from the light-emitting element, and a light diffusing film disposed apart from the light-emitting element for dispersing the light. The light diffusing film consists of a light diffusing part of a fibriform light diffusing material and a transparent part.

20 Claims, 5 Drawing Figures

LIGHT-EMITTING DISPLAY DEVICE INCLUDING LIGHT DIFFUSING FILM

BACKGROUND OF THE INVENTION

This invention relates to a light-emitting display device having an improved light diffusing film.

Light-emitting display devices are utilized in indicators of characters, marks and numerals. The light-emitting display device generally comprises a light-emitting element, a substrate on which the light-emitting element is disposed, a reflector which surrounds the light-emitting element, and a light diffusing film. The light diffusing film plays an important role in the point of uniformly diffusing the light emitted from the light-emitting element. In the past, a light-emitting display device as described in the following has been used. One light diffusing film consists of a light diffusing material which is a powdered material such as $Al_2O_3$, $SiO_2$ or $CaCO_3$, and transparent material. Another light diffusing film consists of a transparent material having a rough face.

The brightness of the light-emitting display device using the above-mentioned light diffusing film, is decreased by the absorptive efficiency of the light diffusing film, in the case where the light diffusing material is such as $Al_2O_3$, $SiO_2$ or $CaCO_3$. The brightness distribution of the light diffusing film is chiefly affected by the grain distribution and by the grain size of the light diffusing material. Therefore, the dispersion of the brightness and the brightness distribution widely vary in the prior art. As a result, it is difficult to produce a desirable characteristic for the light-emitting display device in the prior art.

SUMMARY OF THE INVENTION

The object of this invention is to provide a light-emitting display device which is satisfactory as regards the average brightness characteristics.

Another object of this invention is to provide a light-emitting display device which is satisfactory as regards the brightness distribution characteristics.

The objects of the present invention are achieved by a light-emitting display device including a light emitting element, a substrate on which the light emitting element is disposed, a reflector for effective reflecting the light from the light emitting element and a light diffusing film which includes a light diffusing part of a fibriform light diffusing material.

BRIEF DESCRIPTION OF THE DRAWINGS

A more complete appreciation of the invention and many of the attendant advantages thereof will be readily obtained as the same becomes better understood by references to the following detailed description when considered in connection with the accompanying drawing, wherein.

DETAILED DESCRIPTION OF THE PREFERRED EMBODIMENTS

Figure 1:
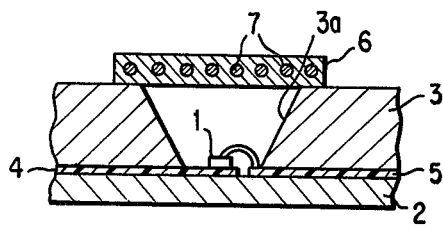
FIG. 1 is a sectional view of a light-emitting display device according to one embodiment of the present invention.

Referring now to the drawings, wherein like reference numerals designate identical or corresponding parts throughout the several views, the light-emitting display device of the present invention is described hereinunder.

In FIG. 1, a light emitting element 1 electrically connected to leads 4 and 5 which are formed on a substrate 2 in a desirable pattern, is disposed on the substrate 2 with the lead 4 interposed therebetween. A reflector 3 which surrounds the light-emitting element 1 is mounted on the substrate 2. The light from the light-emitting element 1 is reflected by the reflective wall 3a of the reflector 3 to a light diffusing film 6. A large number of rods 7 for dispersing the light are arranged to be parallel to one another at regular intervals in a transparent film 8. Also, a large number of fibriform materials for dispersing the light may be arranged to be parallel, to be in a mesh, or at random in the transparent film 8. Furthermore the fibriform material may be in the form of a solid rod or a flexible string.

Figure 2:
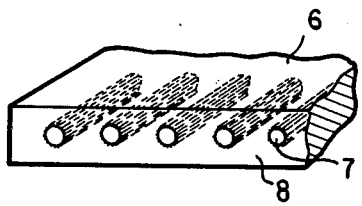
FIG. 2 is an oblique view of the light diffusing film in FIG. 1.
Figure 3:
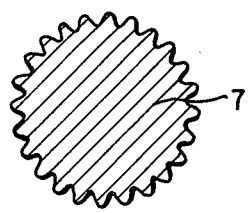
FIG. 3 is a sectional view of the glass fiber shown in the light diffusing film in FIG. 2.

The transparent film 8 is acrylic plastic with 0.2 mm thickness. The radius of rod 7 is about 50 $\mu$, and the rod 7 is subjected to treatment for making its surface uneven. Referring to FIG. 2, a plurality of rods 7 are arranged at regular intervals in the transparent film 8, for example with calendering treatment. The light diffusing film 6 is composed of two parts. One is a transparent part which passes the light emitted from the light-emitting element 1. Another is a light diffusing part which disperses the light from the light-emitting element 1.

The transparent part is made from a transparent material which is able to transmit the light from the light-emitting element 1. Glass, a high molecular compound, air and the like are suitable for the transparent material. In this embodiment thermo-plastic material and thermo-indurative material made from a high molecular compound are used as the transparent part. For the thermo-plastic material, acrylic-plastic, cellulose acetate, polyimide, polycarbonate, polyethylene, polystyrene and the like are suitable and for the thermo-indurative matter epoxy resins, phenolic resin, polyurethane and the like are suitable. The thinner the transparent part, the brighter is the light-emitting display device, because the transparent matter absorbs little light. Therefore, the light diffusing film, that is to say the diffuser including the transparent material, should be as thin as possible. But, the thinner the transparent part, the frailer is the transparent material. Consequently, the desirable thickness of the transparent part is 10$\mu$ to 1000$\mu$; the optimum thickness is 50$\mu$ to 70$\mu$.

The light diffusing part includes a light diffusing material, for instance a fiber glass, a fibriform high molecular compound or a vegetable fiber. For a light diffusing material of fibriform high molecular compound, teflon and the like are suitable the same as for the above-mentioned transparent matter. In case the refractive efficiencies of the light diffusing material and the transparent material are equal, it is necessary to roughen the entire surface of the light diffusing material. In case the light diffusing material is different from the transparent material with regards to refractive efficiency, the roughening is not necessary, because the light is dispersed at the boundary between the light diffusing part and the transparent part on account of the different refractive efficiency. When the ratio of the different refractive efficiencies is above 1.5, the optimum brightness for the light-emitting display device is obtained.

Figure 4:
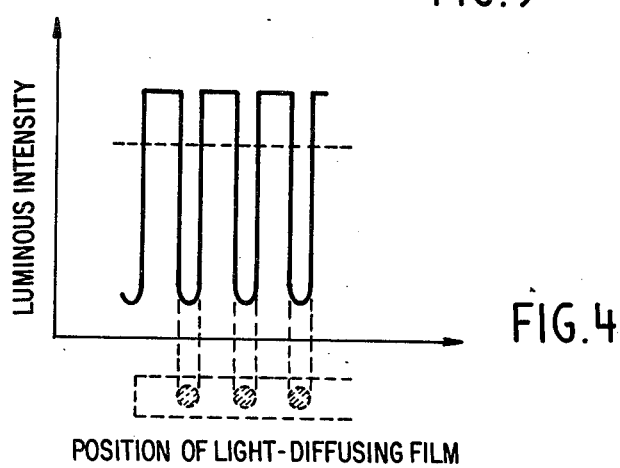
FIG. 4 is a graph showing the relationship between the brightness and the position of the light diffusing film in the present invention.

FIG. 4 shows the relationship between the brightness and the position of the light diffusing film. The luminous intensity of the light-emitting display device is shown by a solid line, and the average luminous intensity characterized by the orientation, namely the average brightness, is shown in a dashed line. The average brightness of the light-emitting display device in the present invention is higher by 50% to 80% than the prior art. Therefore the average brightness of the light-emitting display device in the present invention is greatly improved. Furthermore, it is found to be better that the area ratio of the transparent part to the light diffusing part be equal to or more than 4 to 1 because otherwise, flickering of the light-emitting display device is observed.

Figure 5:
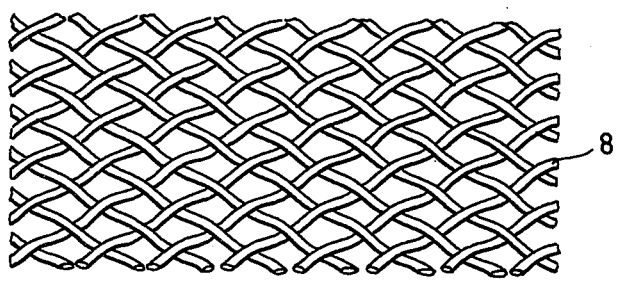
FIG. 5 is an oblique view of a light diffusing film in a light-emitting display device according to another embodiment of the present invention.

Next, the light diffusing film of another embodiment of the present invention is formed in the following way. After many glass fibers are arranged in an intertwined mesh configuration, a press treatment is carried out. A plate of many pressed glass fibers shown in FIG. 5 is formed with a thickness of 0.15 mm. The plate of many glass fibers 8 intertwined at random can be applied to the light-emitting display device too. In this case, the light diffusing part of the plate is made of fiber glass, and the transparent part is made of air. The average brightness mainly depends on the thickness of fiber and the thickness of the plate. The relationship of the average brightness and the intensity ratio between the light-emitting display device in the present invention and in the prior art is shown in the table. The intensity ratio shows the ratio of the brightness distribution between maximum intensity and minimum intensity in the light-emitting display area in the light-emitting display device.

TABLE

|  | AVERAGE BRIGHTNESS (%) | INTENSITY RATIO |
| --- | --- | --- |
| PRIOR ART | 100 | 2.0 |
| EMBODIMENT 1 | 150~180 | 1.5 |
| EMBODIMENT 2 | 130~150 | 2.0 |

The prior art described in the table shows a light-emitting display device, wherein the light diffusing film consists of acrylic plastic and $CaCO_3$ which is added into the light diffusing film at 15 weight percent, and the thickness of the light diffusing film is 0.15 mm.

EMBODIMENT 1

The light diffusing film consists of acrylic plastic and fiber glass having a radius of 0.05 mm, the distance between the glass fibers at regular intervals being about 0.2 mm, and the thickness of the light diffusing film being 0.15 mm. As described in the table, the light-emitting display device has satisfactory brightness characteristics, particularly the characteristic regarding the average brightness and the brightness distribution.

EMBODIMENT 2

The light diffusing film consists of air and fiber glass which has a radius of 0.05 mm, the distance between the glass fibers in a mesh configuration is about 0.3 mm, and the thickness of the light diffusing film is 0.15 mm. As described in the table, the light-emitting display device has a satisfactory average brightness. The light-emitting display device of the present invention is extremely useful for providing a light-emitting display device for which the average brightness is high.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A light-emitting display device comprising:
   (a) a light-emitting element;
   (b) a substrate on which said light-emitting element is disposed;
   (c) a reflector mounted on said substrate so as to surround said light emitting element for reflecting the light from said light-emitting element; and
   (d) a light diffusing film disposed apart from said light-emitting element, said light diffusing film including a light diffusing part with a fibriform light diffusing material and a transparent part made of a transparent material.

2. The light-emitting display device of claim 1 wherein the surface of said fibriform light diffusing material is substantially rough.

3. The light-emitting display device of claim 1 wherein said fibriform light diffusing material is different from said transparent material with regard to the refractive efficiency.

4. The light-emitting display device of claim 3 wherein said fibriform light diffusing material is in a rod configuration.

5. The light-emitting display device of claim 4 wherein said fibriform light diffusing rods are arranged to be substantially parallel at regular intervals.

6. The light-emitting display device of claim 1 wherein the area ratio of said light diffusing part to said transparent part is equal to or less than one-fourth.

7. The light-emitting display device of claim 6 wherein the thickness of said transparent part between said fibriform light diffusing material is below $250\mu$.

8. The light-emitting display device of claim 4 wherein said fibriform light diffusing materials are arranged in a mesh.

9. The light-emitting display device of claim 1 wherein said transparent material is a high molecular compound.

10. The light-emitting display device of claim 9 wherein said high molecular compound consists of a thermo-plastic material.

11. The light-emitting display device of claim 10 wherein said thermo-plastic material is selected from the group consisting of acrylic-plastic, cellulose acetate, polyimide, polycarbonate, polyethylene and polystyrene.

12. The light-emitting display device of claim 9 wherein said high molecular compound consists of a thermo-indurative material.

13. The light-emitting display device of claim 12 wherein said thermo-indurative material is selected from the group consisting of epoxy resins, phenolic resin and polyurethane.

14. The light-emitting display device of claim 8 wherein said transparent material is a glass.

15. The light-emitting display device of claim 1 wherein said fibriform light diffusing material is selected from the group consisting of fiber glass, a fibriform high molecular compound and a vegetable fiber.

16. The light-emitting dislay device of claim 15 wherein said fibriform high molecular compound consists of a thermo-plastic material.

17. The light-emitting display device of claim 16 wherein said thermo-plastic material is selected from the group consisting of acrylic-plastic cellulose acetate, polyimide, polycarbonate, polyethylene and polystyrene.

18. The light-emitting display device of claim 15 wherein said fibriform high molecular compound consists of a thermo-indurative material.

19. The light-emitting display device of claim 18 wherein said thermo-indurative material is selected from the group consisting of epoxy resins, phenolic resin and polyurethane.

20. The light-emitting display device of claim 1 wherein said transparent material is air.

* * * * *